(12) United States Patent
Lee et al.

(10) Patent No.: US 7,767,275 B2
(45) Date of Patent: Aug. 3, 2010

(54) METHOD FOR SYNTHESIZING SELF-ALIGNED CARBON NANOMATERIALS ON LARGE AREA

(75) Inventors: Jae-Kap Lee, Seoul (KR); Phillip John, Edinburgh (GB)

(73) Assignee: Korea Institute of Science and Technology (KR)

( * ) Notice: Subject to any disclaimer, the term of this patent is extended or adjusted under 35 U.S.C. 154(b) by 402 days.

(21) Appl. No.: 11/846,184

(22) Filed: Aug. 28, 2007

(65) Prior Publication Data

US 2008/0213505 A1    Sep. 4, 2008

(30) Foreign Application Priority Data

Dec. 18, 2006    (KR) .................. 10-2006-0129636

(51) Int. Cl.
*H05H 1/24* (2006.01)
*C23C 16/26* (2006.01)

(52) U.S. Cl. ................ 427/580; 427/255.28; 427/569; 977/742

(58) Field of Classification Search ........................ None
See application file for complete search history.

(56) References Cited

U.S. PATENT DOCUMENTS

2003/0202930 A1* 10/2003 Dodelet et al. ........... 423/447.3
2004/0051433 A1* 3/2004 Imai et al. .................. 313/311

OTHER PUBLICATIONS

Diamond-Graphite Nanoflake Hybrid Films, 4th International Nanotech Symposium & Exhibition in Korea, Aug. 30, 2006, 3 pages.

* cited by examiner

*Primary Examiner*—Timothy H Meeks
*Assistant Examiner*—Joseph Miller, Jr.
(74) *Attorney, Agent, or Firm*—Ostrolenk Faber LLP

(57) ABSTRACT

The present invention provides a method for depositing self-aligned carbon nanomaterials (carbon nanoflake, carbon nanotube, carbon nanorod and carbon nanosphere), by inducing a gas chemistry for the carbon nanomaterials, on a substrate having a large area of several inches in diameter, under the conventional CVD diamond deposition conditions. The well-aligned carbon nanomaterials on the large area are applicable for sensitive base materials in the fields including biochemistry and electrochemistry.

9 Claims, 3 Drawing Sheets

CARBON NANOFLAKES (6-1)

CARBON NANORODS (6-2)

CARBON NANOSPHERES (6-3)

METHOD FOR SYNTHESIZING SELF-ALIGNED CARBON NANOMATERIALS ON LARGE AREA

RELATED APPLICATION

The present disclosure relates to a subject matter contained in priority Korean Application No. 10-2006-0129636, filed on Dec. 18, 2006, which is herein expressly incorporated by reference in its entirety.

BACKGROUND OF THE INVENTION

1. Field of the Invention

The present invention relates to a synthesis of carbon nanomaterials (e.g., nanoflake, nanotube, rod, and sphere) by a Chemical Vapor Deposition (CVD) process.

2. Background of the Invention

It is well known that carbon nanomaterials, especially, carbon nanotubes have various excellent properties including a relative large surface area, light weight, high strength, high flexibility, good electrical conductivity, a low field emission voltage, high thermal conductivity, and high thermal stability. Compared with the carbon nanotubes, carbon nanoflakes have two strong points: structural stability due to the lower aspect ratio and the nature aligning vertically to the substrate.

Nonetheless, application of the two materials to industry is very restricted. This is mainly due to a small deposition area (below several $cm^2$) of uniform deposition of well-aligned carbon nanomaterials, originated by non-uniform gas chemistry throughout a larger area.

SUMMARY OF THE INVENTION

Therefore, it is an object of the present disclosure to provide a method of enlarging an area in which carbon nanomaterials such as carbon nanoflakes, carbon nanorods, carbon nanotubes and carbon nanospheres are self-alignedly synthesized on a substrate.

To achieve this and other advantages and in accordance with the purpose of the present invention, there is provided a method for synthesizing carbon nanomaterials, comprising: preparing a substrate set where at least one layer of close packed particles which act as dummy matrixes is placed on a substrate; depositing carbon nanomaterials on the substrate using a CVD method, by inducing a gas chemistry for carbon nanomaterials in a space between the dummy matrixes and the top surface of the substrate; and recovering the substrate, on which the carbon nanomaterials are deposited, by removing the dummy matrixes from the substrate set.

The substrate set is deposited under a high density thermal plasma operating at the conventional condition for conventional diamond coating (especially, a high pressure between 40 and 200 Torr forming a high density thermal plasma). Such deposition enables us to synthesize uniform and self-aligned carbon nanomaterials on a large area up to several tens~several hundreds of $cm^2$, corresponding to a synthesis area of commercialized CVD diamond coating equipments.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of the present invention, with reference to the accompanying drawings.

This invention comprises three steps, ① a first step of preparing a novel substrate set, that is, at least one layer of dummy matrixes (for example, silica spheres) closely packed on a substrate; ② a second step of depositing carbon nanomaterials on the substrate by loading the substrate set into a CVD diamond synthesis apparatus; and ③ a third step of recovering the carbon nanomaterials deposited on the substrate by removing a diamond film consolidated with the dummy matrixes.

Figure 1A:
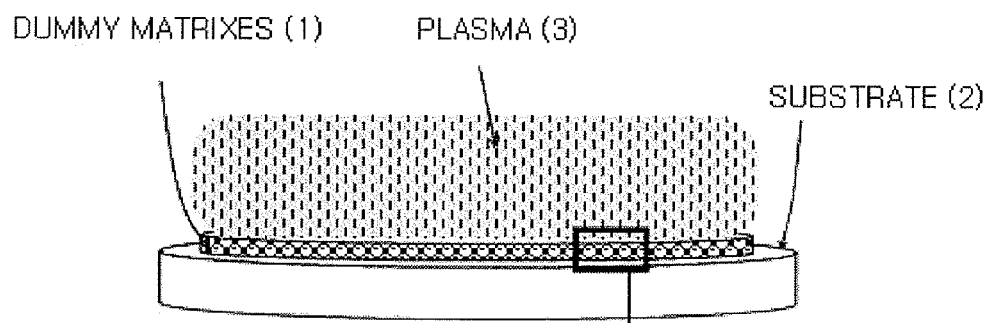
FIGS. 1A to 1D illustrate a process of synthesizing carbon nanomaterials on a substrate in accordance with an embodiment of the present invention.

In the first step, the dummy matrixes (1) are closely packed on the substrate (2) by gentle agitation (FIG. 1A). Materials of the dummy matrixes can be either ceramic or metal stable at the condition for conventional diamond coating. The sizes of dummy matrixes are changeable between 1 nm and 2 mm regardless of their shape. Materials of the substrate can be glass, stainless steel, silicon, molybdenum, tungsten, copper and carbon, etc., which are used for synthesizing diamond, carbon nanotubes or carbon nanoflakes in the conventional art. For some cases, the dummy matrixes and the substrate can be pretreated for easy nucleation of diamond and carbon nanomaterials, respectively. For example, a scratch or a residue on the surface of the dummy matrixes can be formed by soaking the dummy matrixes in a beaker containing alcohol (for example, methanol) in which fine diamond powders less than several μm in diameter are dispersed and generating an ultrasonic bath vibration during a certain time. To deposit well-aligned carbon nanotubes on the substrate, a thin layer of catalyst metal (steel, nickel and cobalt etc.) may be preferably coated on the substrate before preparation of the substrate set.

Figure 1B:
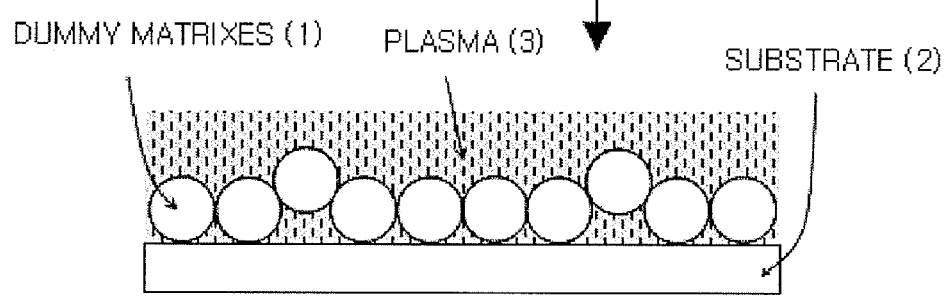
Figure 1C:
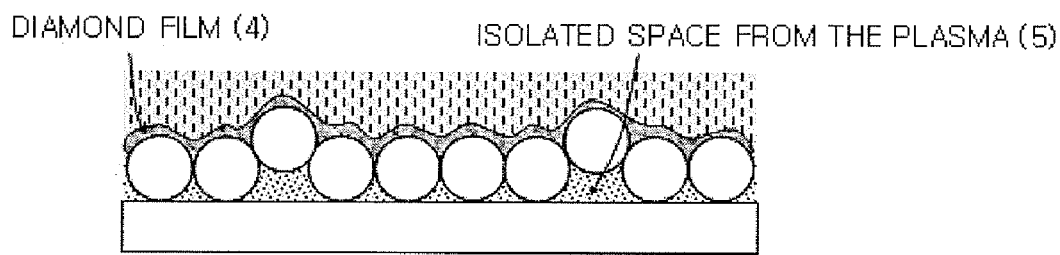
Figure 3:
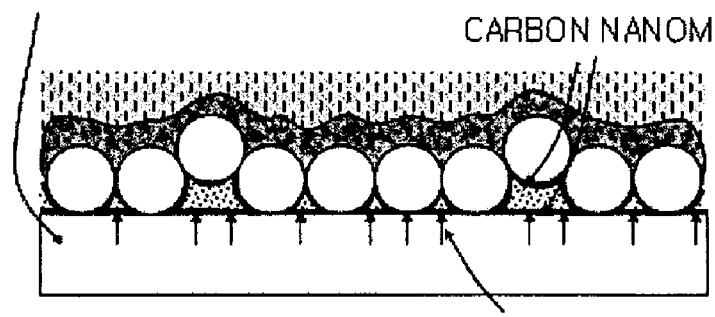
FIG. 3 illustrates a schematic view explaining how carbon atoms work when a carbon-containing substrate is used for depositing carbon nanomaterials.

For the second step, the substrate set is loaded in a CVD diamond coating apparatus. A diamond film (4) can be coated onto the upper surface of the dummy matrixes in contact with a carbon-containing gas activated by high density thermal plasma (in case of plasma CVD) or heat (in case of hot-filament CVD), and this isolates the space (5) between the diamond film and the top surface of the substrate from the plasma or the heat (FIG. 1B). This can induce a gas chemistry in the space (5) which is ideal for deposition of carbon nanomaterials because the influx of atomic hydrogen (H) from the plasma is interrupted by the diamond film (4). Formation time of the diamond film (4) depends upon the size of the dummy matrixes, the pretreatment, and the synthesis conditions (temperature and gas composition). When pretreated micron-sized dummy matrixes are used, 2-3 hours are generally required. When nano-sized dummy matrixes are used, the time is within several tens of minutes. Preferably, the pressure inside the CVD synthesis chamber is 40~200 Torr, and the deposition temperature on the upper surface of the dummy matrixes is 600~900° C. Meanwhile, existence of sub-micron sized dummy matrixes themselves without the diamond film can be enough to induce the gas chemistry. As a result, carbon nanomaterials (6), normally carbon nanoflakes, are deposited on the substrate (FIG. 1C). In addition, if a carbon containing material like stainless steel is used as the substrate, a greater amount of carbon nanomaterials can be deposited due to additional carbon atoms diffused from the inside of the substrate (FIG. 3). The use of the novel substrate set under the high density thermal plasma can provide the gas chemistry on a area as large as 8 inches in diameter, corresponding to the uniform deposition area of commercialized diamond coating equipments.

Figure 1D:
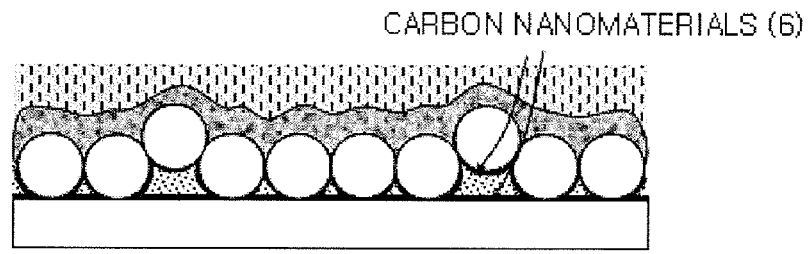
Figure 1D:

In the third step, carbon nanomaterials (6) deposited on the substrate can be recovered by removing the diamond film consolidated with the dummy matrixes from the substrate (FIG. 1D). Actually the diamond film is spontaneously separated from the substrate during cooling of the substrate from the deposition temperature of around 800° C. to the room temperature after the synthesis has been completed due to the difference in thermal expansion coefficient between diamond ($1 \times 10^{-6}$) and the substrate which is normally higher than that of diamond. Uncoated zone (7) on the substrate is the portion having been contacted with the dummy matrixes.

Figure 2A:
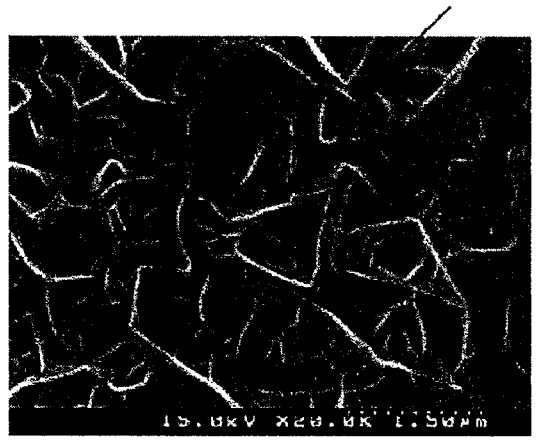
FIGS. 2A to 2C show pictures of carbon nanomaterials, carbon nanoflakes (FIG. 2A), carbon nanorods (FIG. 2B) and carbon nanospheres (FIG. 2C), deposited in the process illustrated in FIGS. 1A to 1D.
Figure 2B:
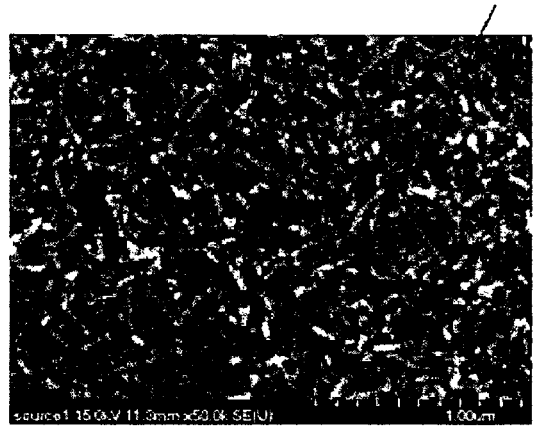
Figure 2C:

FIGS. 2A to 2C show pictures of carbon nanomaterials deposited on substrates. FIG. 2A shows carbon nanoflakes (6-1) comprising interlaced flakes of lateral dimensions about 1~2 μm and a thickness of less than a few nm. FIGS. 2B and 2C show carbon nanorods (6-2) with the diameter of approximately 50 nm and the length of several hundreds of nm and carbon nanospheres (6-3) with a diameter of several tens of nm~200 nm, respectively.

FIG. 3 illustrates a schematic view explaining how carbon atoms work when a carbon-containing substrate (2-1) is used for depositing carbon nanomaterials. If a stainless steel is used as the substrate, carbon atoms pre-contained inside can diffuse to the reaction surface of the substrate (8) and contribute to deposition of the carbon nanomaterials (6), resulting in increase of the amount of the carbon deposits. Here, carbon nanotubes, carbon nanospheres or carbon nanorods can be deposited normally instead of the carbon nanoflakes.

Hereinafter, examples of the present invention will be described in detail in accordance with the preferred embodiments, which are not limited in scope by the examples described hereinafter.

Example 1

A molybdenum substrate with a diameter of 10 cm on which a layer of the pretreated dummy matrixes (silica spheres of 10~30 μm in diameter) was closely packed by gentle agitation was loaded on the anode of the multi-cathode direct current plasma CVD diamond synthesis apparatus, and deposited for 2 hours and 30 minutes under the normal condition for diamond deposition, an input power of 15 kW, a composition of methane gas in hydrogen gas of 10%, a pressure of 100 Torr and a gas flow of 200 sccm. The average temperature of top surfaces of the dummy matrixes, adjusted by direct plasma heating balanced against the water coolant flow inside the anode, was estimated to be between 700° C. and 800° C. The temperature of the bottom surface was estimated to be lower by a few tens of degrees. Accurate temperatures could not be measured because the pyrometer response was affected by the hot (>2000° C.) cathode emission. In this condition, a growth rate of the CVD diamond film on the upper surface of the dummy matrixes is approximately 10 μm/h.

After the synthesis, the diamond film consolidated with the dummy matrixes was spontaneously separated from the substrate, and black-colored materials were uniformly observed on the substrate. In FESEM observation, flake-like morphology was appeared on the substrate, comprising interlaced flakes of lateral dimensions about 1-2 μm and a thickness of less than few nmas shown in FIG. 2A. The materials were analyzed as carbon nanoflakes by Raman analysis.

Example 2

A copper substrate with a diameter of 10 cm on which one or two layers of the pretreated dummy matrixes (2~5 μm in diameter) were closely packed was loaded on the anode of the multi-cathode direct current plasma CVD diamond synthesis apparatus, and deposited for an hour under the same condition described in Example 1.

Here carbon nanoflakes which were much similar with those observed in Example 1 were also uniformly appeared on the substrate. This indicates carbon nanomaterials can be deposited in a shorter time when smaller particles are used as dummy matrixes.

Example 3

A stainless steel substrate with a size of 3×3 $cm^2$ on which a layer of the pretreated dummy matrixes (10~30 μm in diameter) was closely packed by gentle agitation was loaded in a multi-cathode direct current plasma CVD diamond synthesis apparatus, and synthesized for 2 hours under the same condition described in the Example 1, except for an input power of 10 kW decreased. The temperature on the top surface of the layer of particles was maintained at approximately 700° C. Here, as shown in FIGS. 2B and 2C, carbon nanorods with a length of hundreds of nm and a diameter of tens of nm and carbon nanospheres with a diameter of approximately 100 nm were deposited on the substrate, respectively. The synthesis amount per unit area was approximately 50% more than that of Example 1. The increase of the amount of deposits was due to additional carbon atoms diffused from the inside of the stainless steel substrate.

Example 4

A graphite substrate having a size of 5×5 $cm^2$ on which a layer of the pretreated dummy matrixes (10~30 μm in diameter) were closely packed by gentle agitation was loaded in a multi-cathode direct current plasma CVD diamond synthesis apparatus, and synthesized for 2 hours under the same condition described in the Example 1.

After the synthesis, the diamond film consolidated with the dummy matrixes from the substrate was spontaneously separated from the graphite substrate. The amount of deposits per unit area was approximately 100% greater than that in Example 1. The increase in the synthesis amount was due to participation of carbon atoms supplied from the graphite substrate in the synthesis of the carbon nanospheres.

Example 5

A glass substrate with a size of 2×2 $cm^2$ on which a layer of the pretreated dummy matrixes (10~30 μm in diameter) were closely packed by gentle agitation was loaded in a multi-cathode direct current plasma CVD diamond synthesis apparatus, and deposited for 2 hours under the same condition described in the Example 1. The temperature on the bottom surface of the layer of particles was kept low approximately 450° C. With the synthesis, black-colored materials were uniformly observed on the substrate. The materials were confirmed to be the carbon flakes by FESEM observation.

Example 6

A silicon substrate of 50 mm in diameter, on which metal (nickel) catalyst for carbon nanotubes was coated in a thickness of approximately 10 nm and consequently a layer of the pretreated dummy matrixes (10~30 μm in diameter) were closely packed by gentle agitation was loaded in a multicathode direct current plasma CVD diamond synthesis apparatus, and synthesized for 2 hours under the same condition described in the Example 1. With the synthesis, black-colored materials were uniformly observed on the substrate. The materials were well-aligned carbon nanotubes with a thickness of approximately 1 μm by FESEM observation As described above, in the present invention, when synthesized under CVD diamond synthesis conditions by using layered silica spheres as dummy matrixes, a diamond film is deposited on the upper surface of the dummy matrixes and a gas chemistry condition in which carbon nanomaterials become grown is formed in a space between the dummy matrixes and the top surface of a substrate to enable well-aligned carbon nanoflakes, carbon nanotubes, carbon nanorods and carbon nanospheres to be uniformly synthesized on a large area, which cannot be implemented in the prior art. Considering that the commercialized CVD diamond synthesis apparatus has a maximum synthesis area of 50×100 $cm^2$, the carbon nanomaterials self-aligned on the substrate, prepared in accordance with the present invention, can be used as electrode materials for a secondary battery or an ultra-high capacity, and as electron emitter materials for an FED or an LCD in the display field.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for synthesizing carbon nanomaterials, comprising:
   preparing a substrate set where at least one layer of close packed particles which act as dummy matrixes is placed on a substrate;
   depositing carbon nanomaterials on the substrate using a CVD method, by inducing a gas chemistry for carbon nanomaterials in a space between the dummy matrixes and the top surface of the substrate; and
   recovering the substrate, on which the carbon nanomaterials are deposited, by removing the dummy matrixes from the substrate set,
   wherein a diamond film is coated onto the upper surface of the dummy matrixes in contact with a carbon-containing gas activated by plasma or heat, and the diamond film isolates the space from the plasma or the heat thus to induce the gas chemistry for carbon nanomaterials.

2. The method of claim 1, wherein the dummy matrixes have an average size between of a sub-micron size in diameter, inducing the gas chemistry for carbon nanomaterials.

3. The method of claim 1, wherein the substrate is pretreated by forming a thin layer of catalyst metal for easy deposition of carbon nanomaterials on, prior to the step of preparing the substrate set.

4. The method of claim 1, wherein the carbon nanomaterials are in the forms of flakes, tubes, spheres or a mixture of these materials.

5. The method of claim 1, wherein the dummy particles are ceramic or metal.

6. The method of claim 1, wherein sizes of the dummy particles are in the range of 1 nm to about 2 mm.

7. The method of claim 1, wherein the substrate contains carbon component.

8. The method of claim 1, the dummy matrixes is spontaneously separated from the substrate, on which the carbon nanomaterials are deposited, during cooling of the substrate set.

9. A method for synthesizing carbon nanomaterials, comprising:
   preparing a substrate set where at least one layer of close packed particles which act as dummy matrixes is placed on a substrate;
   depositing carbon nanomaterials on the substrate using a CVD method, by inducing a gas chemistry for carbon nanomaterials in a space between the dummy matrixes and the top surface of the substrate; and
   recovering the substrate, on which the carbon nanomaterials are deposited, by removing the dummy matrixes from the substrate set,
   wherein the dummy matrixes are pretreated by ultrasonic irradiation using diamond powders dispersed in alcohol for facile nucleation, prior to the step of preparing the substrate set.

* * * * *